(12) United States Patent
Kienmayer et al.

(10) Patent No.: US 8,098,471 B2
(45) Date of Patent: Jan. 17, 2012

(54) INTEGRATED CIRCUIT ARRANGEMENT AND CIRCUIT ARRAY

(75) Inventors: Christoph Kienmayer, Unterhaching (DE); Martin Streibl, Petershausen (DE); Marc Tiebout, Munich (DE)

(73) Assignee: Infineon Technologies AG, Neubiberg (DE)

( * ) Notice: Subject to any disclaimer, the term of this patent is extended or adjusted under 35 U.S.C. 154(b) by 385 days.

(21) Appl. No.: 11/574,066

(22) PCT Filed: Aug. 9, 2005

(86) PCT No.: PCT/DE2005/001405
§ 371 (c)(1),
(2), (4) Date: Sep. 24, 2007

(87) PCT Pub. No.: WO2006/021181
PCT Pub. Date: Mar. 2, 2006

(65) Prior Publication Data
US 2008/0055803 A1    Mar. 6, 2008

(30) Foreign Application Priority Data

Aug. 24, 2004    (DE) .......................... 10 2004 040 973

(51) Int. Cl.
*H02H 3/22* (2006.01)
(52) U.S. Cl. .......................................... 361/111; 361/56
(58) Field of Classification Search .................... 361/56, 361/111
See application file for complete search history.

(56) References Cited

U.S. PATENT DOCUMENTS

| | | | | |
|---|---|---|---|---|
| 4,021,621 A | * | 5/1977 | Wycheck | 379/161 |
| 5,497,163 A | * | 3/1996 | Lohninger et al. | 342/175 |
| 5,610,425 A | * | 3/1997 | Quigley et al. | 257/358 |
| 5,637,887 A | * | 6/1997 | Consiglio | 257/109 |
| 6,233,130 B1 | * | 5/2001 | Lin | 361/118 |
| 6,873,505 B2 | * | 3/2005 | Chen et al. | 361/56 |
| 2003/0183403 A1 | | 10/2003 | Kluge et al. | |
| 2003/0231446 A1 | | 12/2003 | Leete | |
| 2004/0075964 A1 | * | 4/2004 | Ker et al. | 361/113 |

FOREIGN PATENT DOCUMENTS

DE    10214068    10/2003

OTHER PUBLICATIONS

S. Galal et al., "Broadband ESD Protection Circuits in CMOS Technology", IEEE Journal of Solid-State Circuits, vol. 38, No. 12, Dec. 2003, pp. 2334-2340.*

(Continued)

*Primary Examiner* — Rexford Barnie
*Assistant Examiner* — Tien Mai
(74) *Attorney, Agent, or Firm* — Dicke, Billig & Czaja, PLLC

(57) ABSTRACT

One aspect is an integrated circuit arrangement. The arrangement includes a first terminal, which can be brought to a first supply potential, a second terminal, which can be brought to a second supply potential, and a supply potential path formed between the first terminal and the second terminal. There is an electrostatic discharge element at least in the supply potential path. There is a signal input pad, to which an input signal can be applied and a signal output, at an output signal can be provided. A first inductance is arranged between the signal input pad and the signal output, and a second inductance is arranged between the signal output and the first terminal.

20 Claims, 9 Drawing Sheets

OTHER PUBLICATIONS

Linten et al., "Design-driven Optimisation of a 90 nm RF CMOS Process by Use of Elevated Source/Drain," pp. 43-46, 2003 IEEE.*

Galal, Sherif et al., "Broadband ESD Protection Circuits in CMOS Technology," IEEE International Solid-State Circuits Conferences 2003, High Speed Building Blocks, Paper 10.5, pp. 10 (2003).

Hyvonen, S. et al., "Cancellation Technique to Provide ESD Protection for Multi-GHz RF Inputs," Electronics Letters, vol. 39, Issue 3, pp. 284-286 (Feb. 6, 2003). (Abstract Only, 1 pg.).

Hyvonen, Sami et al., "Comprehesive ESD Protection for RF Inputs," EOS/ESD-Symposium, pp. 188-194 (2003).

Ker, Ming-Dou et al., "A Novel LC-tank ESD Protection Design for Giga-Hz RF Circuits," IEEE, Radio Frequency Integrated Circuits (RFIC) Symposium, pp. 115-118 (Jun. 8-10, 2003). (Abstract Only, 1 pg.).

Ker, Ming-Dou et al., "ESD Protection Design for Giga-Hz RF CMOS LNA with Novel Impedance-Isolation Technique," EOS/ESD-Symposium, pp. 204-213 (2003).

Kuchling, H, "Taschenbuch der Physik [Pocket book of physics]," 12th edition, pp. 438-440 (1989). (English Abstract 1 pg.).

Leroux, P. et al., "High-Performance 5.2 GHz LNA with On-Chip Inductor to Provide ESD Protection," Electronics Letters, vol. 37, No. 1, pp. 467-469 (Mar. 2001).

Leroux, P. et al., "A 0.8dB NF ESD-Protected 9mW CMOS LNA," IEE International Solid-State Circuits Conference 2001, Session 26, Wireless Building Blocks II/0, pp. 10 (2001).

Liebermann, Thomas et al., "A Low Phasenoise, Differentially Tuned, 1.8 GHz Power VCO with an ESD-compatible 14dBm Output Stage in Standard Digital Cmos," ESSCIRC Proceedings, pp. 4 (Sep. 2001).

Mandavi, Shahram et al., "Fully Integrated 2.2-mW CMOS Front End for a 900-MHz Wireless Receiver," IEEE Journal of Solid-State Circuits, vol. 37, No. 5, pp. 662-669 (May 2002).

Mergens, M.P.J. et al., "Diode-triggered SCR (DTSCR) for RF-ESD Protection of BiCMOS SiGe HBTs and CMOS Ultra-thin Gate Oxides," IEEE, Electron Devices Meeting, pp. 21.3.1-21.3.4 (Dec. 8-10, 2003). (English Abstract Only, 1 pg.).

Vassilev, V. et al., "Co-Design Methodology to Provide High ESD Protection Levels in the Advanced RF Circuits," EOS/ESD Symposium, pp. 195-203 (2003).

Vassilev, V. et al., "ESD-RF Co-Design Methodology for the State of the Art RF-CMOS Blocks," Microelectronics and Reliability, vol. 45, No. 2, pp. 255-268 (2005). (English Abstract Only, 1 pg.).

* cited by examiner

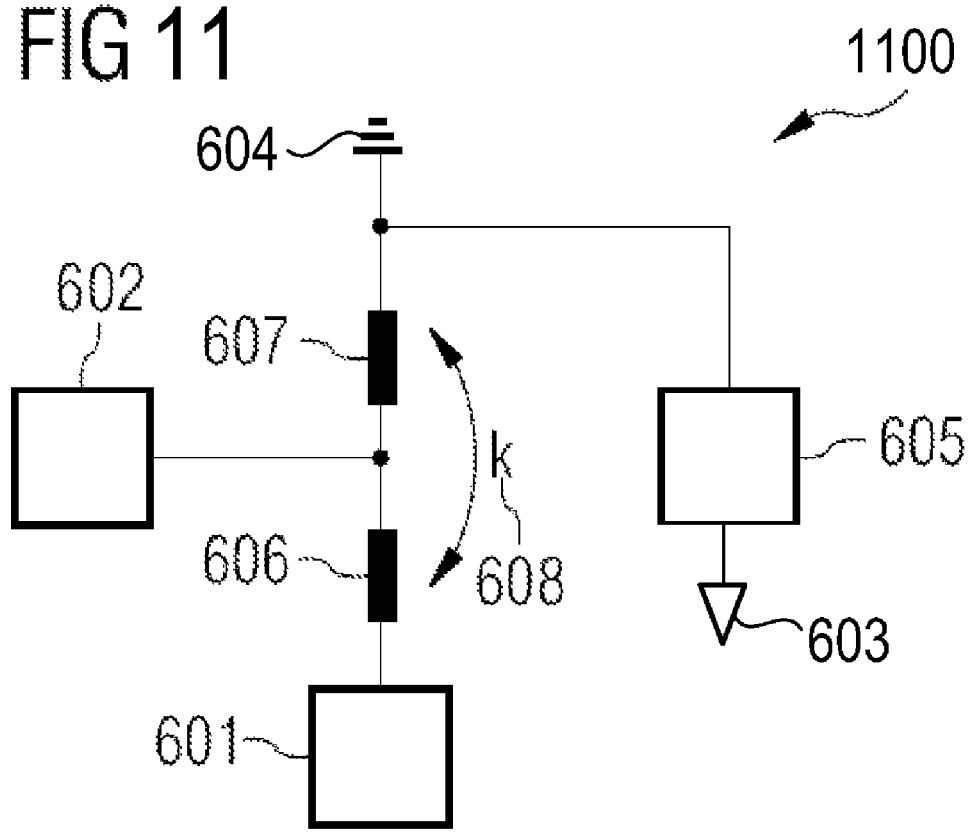

US 8,098,471 B2

INTEGRATED CIRCUIT ARRANGEMENT AND CIRCUIT ARRAY

CROSS REFERENCE TO RELATED APPLICATION

This Utility patent application claims the benefit of the filing date of German Application No. DE 10 2004 040 973.0, filed Aug. 24, 2004, and International Application No. PCT/DE2005/001405, filed Aug. 9, 2005, both of which are herein incorporated by reference.

BACKGROUND

The invention relates to an integrated circuit arrangement and a circuit array.

"Electrostatic Discharge" (ESD) describes the processes and effects when electrical charges are equalized between two differently charged components. If the latter come into contact with one another, positive and negative charges are exchanged, and this may give rise to damage in an electrical circuit.

In an integrated circuit, an upper operating potential $V_{DD}$ and lower operating potential $V_{SS}$ are frequently provided, between which provision is made of protection mechanisms for avoiding damage on account of ESD.

ESD, that is to say electrostatic discharges, are often the cause of damage to or destruction of an integrated circuit and thus cause high financial damage. The development of MOS technology ("metal oxide semiconductor") in microelectronics has been accompanied by a miniaturization of the semiconductor components at increasingly high clock rates. This results in a rising sensitivity towards ESD pulses, that is to say high voltage and current spikes of such clock signals. Semiconductor components under ESD stress can cause errors in an integrated circuit. ESD can lead to a total failure of or damage to the component. Therefore, protection against electrostatic discharges (ESD protection) is important nowadays in all areas of microelectronics.

ESD protection in radiofrequency circuitry applications is a difficult technical problem, since the high parasitic capacitance of ESD protection elements inherently greatly restricts the maximum operating frequency that can be achieved for the circuit. Such ESD protection elements are, for example, a diode, a thyristor or a "grounded n-MOS" component (that is to say an n-MOS field effect transistor with a gate terminal at the electrical ground potential). Smaller ESD protection elements would enable higher frequencies, but do not sufficiently satisfy the functionality as ESD protection, that is to say are not sufficiently able to dissipate ESD currents.

A description is given below, referring to FIG. 1, of a circuit arrangement 100 with ESD protection in accordance with the prior art.

In the case of the circuit arrangement 100, an input signal can be provided at a signal input pad 101 and be fed to an input/output circuit 102. In order to supply the circuit arrangement 100 with electrical energy, a supply potential 103 $V_{DD}$ is provided, and an electrical ground potential 104 GND. A first ESD protection element 105 is provided between the signal input pad 101 and the supply potential 103 $V_{DD}$. Furthermore, a second ESD protection element 106 is provided between the signal input pad 101 and the electrical ground potential 104.

Furthermore, FIG. 1 illustrates a circuit arrangement 110, which has, in addition to the components of the circuit arrangement 100, a nonreactive resistor 111 between the signal input pad 101 and the input/output circuit 102.

FIG. 1 clearly illustrates circuit arrangements 100, 110 having protection against high voltages through the provision of the ESD protection elements 105, 106, since the latter electrically decouple the supply potential 103 $V_{DD}$ from the ground potential 104 GND.

In the case of a large electric current intensity, the ESD elements 105, 106 have to be sufficiently large. In radiofrequency applications, however, large ESD elements lead to an undesirable large parasitic capacitance.

Approaches for ESD protection circuit arrangements for radiofrequency circuits are disclosed in Ming-Dou Ker et al., EOS/ESD-Symp. Proceedings 2003, pages 204-213; Vassilev, V et al., EOS/ESD-Symp. Proceedings 2003, pages 195-203; Hyvonen et al., EOS/ESD-Symp. Proceedings 2003, pages 188-194; Galai, S, Razavi, B "Broadband ESD Protection Circuits in CMOS-Technology", Proceedings ISSCC 2003, paper 10.5; Leroux, P, Steyaert, M "A high performance 5.2 GHz LNA with an on-chip inductor to provide ESD-protection", IEE Electronics Letters, Volume 37, No. 1, pages 467-469, March 2001; Leroux P, Janssens, J, Steyaert, M "A 0.8-dB NF ESD-protected 9-mW CMOS LNA", ISSCC Dig. Tech. Papers, Volume 26, pages 410-411, 2001; Mandavi, S, Abidi, A "Fully integrated 2.2-mW CMOS Front End for a 900-MHz Wireless Receiver", IEEE JSSC, May 2002; and Liebermann, T, Tiebout, M "A Low Phasenoise, Differentially Tuned, 1.8-GHz Power VCO with an ESD-compatible 14-dBm Output Stage in Standard Digital CMOS", ESSCIRC Proceedings, Villach, September 2001

The approach disclosed in Leroux, P, Steyaert, M "A high performance 5.2 GHz LNA with an on-chip inductor to provide ESD-protection", IEE Electronics Letters, Volume 37, No. 1, pages 467-469, March 2001; Leroux P, Janssens, J, Steyaert, M "A 0.8-dB NF ESD-protected 9-mW CMOS LNA", ISSCC Dig. Tech. Papers, Volume 26, pages 410-411, 2001, and Mandavi, S, Abidi, A "Fully integrated 2.2-mW CMOS Front End for a 900-MHz Wireless Receiver", IEEE JSSC, May 2002, essentially consists in using smaller ESD protection elements.

FIG. 2 illustrates an ESD protection circuit 200 such as is disclosed in Mandavi, S, Abidi, A "Fully integrated 2.2-mW CMOS Front End for a 900-MHz Wireless Receiver", IEEE JSSC, May 2002.

FIG. 3 illustrates an ESD protection circuit arrangement 300 disclosed in Leroux P, Janssens, J, Steyaert, M "A 0.8-dB NF ESD-protected 9-mW CMOS LNA", ISSCC Dig. Tech. Papers, Volume 26, pages 410-411, 2001, in the case of which arrangement the ESD protection is realized by a first ESD protection diode 301 and by a second ESD protection diode 302.

The approaches in accordance with Leroux, P, Steyaert, M "A high performance 5.2 GHz LNA with an on-chip inductor to provide ESD-protection", IEE Electronics Letters, Volume 37, No. 1, pages 467-469, March 2001; Leroux P, Janssens, J, Steyaert, M "A 0.8-dB NF ESD-protected 9-mW CMOS LNA", ISSCC Dig. Tech. Papers, Volume 26, pages 410-411, 2001, and Mandavi, S, Abidi, A "Fully integrated 2.2-mW CMOS Front End for a 900-MHz Wireless Receiver", IEEE JSSC, May 2002, have the disadvantage, however, that they usually have only low ESD strength, and that the range of processable radio frequencies with which the circuit arrangements can be operated is restricted. At higher frequencies such as 5 GHz or 17 GHz such as are used for WLAN systems ("wireless local area network") these approaches are thus only poorly suitable or no longer suitable at all.

An alternative approach in accordance with Ming-Dou Ker et al., EOS/ESD-Symp. Proceedings 2003, pages 204-213; Vassilev, V et al., EOS/ESD-Symp. Proceedings 2003, pages 195-203; Hyvonen et al., EOS/ESD-Symp. Proceedings 2003, pages 188-194; and Galai, S, Razavi, B "Broadband ESD Protection Circuits in CMOS-Technology", Proceedings ISSCC 2003, paper 10.5, essentially consists in decoupling the ESD protection elements using LC resonant circuits realized on-chip, or in tuning the capacitance of each ESD element in an LC resonant circuit.

The ESD protection circuit arrangement 400 illustrated in FIG. 4 represents a solution such as is disclosed in Galai, S, Razavi, B "Broadband ESD Protection Circuits in CMOS-Technology", Proceedings ISSCC 2003, paper 10.5. The ESD protection circuit arrangement 400 is provided with a first ESD protection subcircuit 401 and a second ESD protection subcircuit 402, an ESD capacitance 403 representing a (parasitic) capacitance of the ESD protection elements 401, 402.

What is disadvantageous about the approach in accordance with Ming-Dou Ker et al., EOS/ESD-Symp. Proceedings 2003, pages 204-213; Vassilev, V et al., EOS/ESD-Symp. Proceedings 2003, pages 195-203; Hyvonen et al., EOS/ESD-Symp. Proceedings 2003, pages 188-194; and Galai, S, Razavi, B "Broadband ESD Protection Circuits in CMOS-Technology", Proceedings ISSCC 2003, paper 10.5, is the high area requirement of the integrated inductances.

In the case of the ESD protection circuit arrangement 500 disclosed in Liebermann, T, Tiebout, M "A Low Phasenoise, Differentially Tuned, 1.8-GHz Power VCO with an ESD-compatible 14-dBm Output Stage in Standard Digital CMOS", ESSCIRC Proceedings, Villach, September 2001, which is illustrated in FIG. 5, an inductance is used instead of traditional ESD protection elements. ESD protection is clearly achieved by the standard ESD protection elements coupled to the supply voltage.

Consequently, the ESD protection circuit arrangement 500 is provided with a first inductance 501 and a second inductance 502, but also a capacitance 503. Furthermore, a plurality of signal inputs 101 and a plurality of signal outputs 102 are provided.

DE 102 14 068 A1 Describes an ESD protection circuit for radiofrequency input/output terminals in an integrated circuit. The integrated circuit includes an ESD protection circuit having an inductance, which inductance is connected between an input terminal and a ground terminal, to which an RF signal is applied. The inductance is set up such that a current carrying capacity that suffices for ESD events is provided. The inductance value of the inductance is chosen such that, in conjunction with a parasitic capacitance present, a resonant circuit having a resonant frequency is formed, which resonant frequency is adapted to the RF signal. The operating frequency of the integrated circuit described in [9] is not restricted by the ESD protection circuit. For the protection of an output terminal against ESD, an inductance can be connected to an auxiliary voltage in order to bias an output transistor. Furthermore, clamping elements (e.g., diodes) are provided between the auxiliary voltage and the supply voltage and between the auxiliary voltage and the ground potential.

SUMMARY

One aspect of the invention provides a circuit arrangement which enables a reliable ESD protection even for radiofrequency applications.

The integrated circuit arrangement according to one embodiment of the invention contains a first terminal, which can be brought to a first supply potential, and a second terminal, which can be brought to a second supply potential, a supply potential path being formed between the first terminal and the second terminal. Furthermore, an electrostatic discharge element is provided in the supply potential path. Moreover, a signal input pad is provided, to which an input signal can be applied, and a signal output is provided, at which an output signal can be provided. Moreover, the circuit arrangement contains a first inductance, which is arranged between the signal input pad and signal output, and a second inductance, which is arranged between the signal output and the first terminal.

The circuit array according to one embodiment of the invention contains an integrated circuit arrangement having the features described above and also a useful circuit coupled to the integrated circuit arrangement.

One aspect of the invention can be seen in the realization of an effective ESD protection, which is also suitable for a radiofrequency circuit, by connecting up an electrostatic discharge element (ESD protection element) into the supply potential path between an upper supply potential and a lower supply potential. This interconnection is combined with a skillful coupling of the first inductance and the second inductance (with the formation of a coupling inductance), which inductances are provided between the signal output, on the one hand, and one of the two supply potentials and the signal input pad, on the other hand. In the case of the solution according to one embodiment of the invention, traditional protection elements and an associated (parasitic) capacitance are completely avoided, and clearly replaced by a direct current short circuit (DC short circuit) to the supply voltage via the coils (inductances). By suitable selection of design variables of the circuit (the values of inductances, selection and design of ESD protection elements, setting up of auxiliary capacitances), it is readily possible to tune the structure in such a way that a radiofrequency bandpass passband is ensured which permits radio frequencies in a range of interest to pass approximately without any attenuation. This bandpass characteristic furthermore enables noise to be suppressed.

The circuit arrangement of one embodiment of the invention is realized as a monolithically integrated circuit (in a silicon chip) in which an effective ESD protection is made possible on-chip.

One embodiment of the invention can clearly also be seen in the fact that RF bandpass ESD protection is created with which even very high radio frequencies can be realized with a minimal area requirement. Simulations have illustrated that with small coils (for example coils having a total inductance of 300 pH and a layout area of 40×40 μm$^2$), radio frequencies of 1 GHz to 17 GHz can be passed through the circuit arrangement or be processed by the latter without any problems.

The bandpass characteristic of the circuit arrangement according to one embodiment of the invention is desirable in many cases since concrete applications of the circuit arrangement (that is to say useful circuits coupled to the latter and based on technologies such as GSM ("global system for mobile communications"), UMTS ("universal mobile telecommunication system") or WLAN ("wireless local area network")) are defined in a band-limited frequency spectrum anyway.

In contrast to the solution in accordance with Galai, S, Razavi, B "Broadband ESD Protection Circuits in CMOS-Technology", Proceedings ISSCC 2003, paper 10.5, the non-reactive resistor $R_T$ from FIG. 4 is obviated. Furthermore, the ESD protection subcircuits 401, 402 and the ESD protection elements $C_L$ 400 from FIG. 4 are replaced by a DC short circuit via the inductances.

One embodiment of the invention can therefore be seen in connecting up a combination of a low-frequency short circuit of an inductance as ESD protection with a skillful coil coupling and coil interconnection, for example, with capacitances, to form a bandpass passband for RF frequencies.

The inductance or the inductances clearly serves or serve as short circuit to a supply voltage for the ESD pulses.

The invention can be realized with a small dimensioning of the coupled coil; a coil area of only 40×40 µm² can be achieved without any problems.

Another embodiment of the invention can be seen in the fact that the ESD element is often accommodated in the radiofrequency path in accordance with the prior art, whereas the ESD element is at least also arranged in the supply path according to one embodiment of the invention.

The first supply potential may be an upper operating potential (for example an operating potential $V_{DD}$), and the second supply potential may be a lower operating potential (for example the electrical ground potential $V_{SS}$) (illustrated in FIG. 6, for example).

The first supply potential may be a lower operating potential (for example the electrical ground potential $V_{SS}$), and the second supply potential may be an upper operating potential (for example $V_{DD}$) (illustrated in FIG. 11, for example).

The electrostatic discharge element may be realized as a diode. Furthermore, the electrostatic discharge element may also be formed from a plurality of components, for example from a plurality of diodes.

The electrostatic discharge element may have a thyristor (or a plurality of thyristors).

The electrostatic discharge element may have one or a plurality of field-effect transistors. The field-effect transistor may be a so-called grounded n-MOS field-effect transistor. In the case of a grounded n-MOS field-effect transistor, the gate terminal is grounded, that is to say it is brought to the electrical ground potential.

Clearly, ESD protection elements known per se can be combined with the novel architecture of the circuit arrangement according to one embodiment of the invention, resulting in a small area requirement of the circuit arrangement.

The input signal to the signal input pad may be a radiofrequency signal. The integrated circuit arrangement is also outstandingly suitable for processing radiofrequency signals and represents a skilful solution to the difficult technical problem of implementing ESD protection in radiofrequency applications.

The circuit arrangement according to one embodiment of the invention may be provided with a radiofrequency processing circuit (for example, processing circuit 930 in FIG. 9) connected to the signal output, for example an input/output RF circuit.

The first inductance and the second inductance may be provided as a common inductance.

In particular, the common inductance may be a coil with a center tap, the center tap being coupled to the signal output, a first coil end section being coupled to the signal input pad and a second coil end section being coupled to the electrostatic discharge element.

Moreover, according to one embodiment of the invention a first capacitor of a circuit arrangement may be connected up, said capacitor being arranged between the first terminal and the signal input pad.

A second capacitor of a circuit arrangement may also be provided, said capacitor being arranged between the second terminal and the signal input pad.

The circuit arrangement may be set up as a bandpass filter for a radiofrequency signal provided at the signal input pad. It is thereby possible for low-frequency or high-frequency noise contributions to be filtered out and for a signal defined in a bandpass filter to be reliably conducted through the circuit arrangement, a more reliable ESD protection simultaneously being provided.

The circuit arrangement is set up as a monolithically integrated circuit. Therefore, the circuit arrangement can be monolithically integrated in a substrate, for example in a semiconductor substrate, in particular in a silicon substrate (for example in a silicon chip). Therefore, the production of the circuit arrangement according to one embodiment of the invention can benefit from the advantages of mature silicon microtechnology, and the circuit arrangement can be provided in miniaturized size.

In the case of the integrated circuit arrangement, the first inductance and the second inductance may in each case be set up as (monolithically) integrated inductance. This measure means that the entire circuit arrangement can be provided in a miniaturized fashion and be fabricated with minimal space requirement and thus cost-effectively.

A signal output pad may be provided at the signal output.

Furthermore, in the case of the integrated circuit arrangement, the first inductance and the second inductance may be coupled in such a way that a coupling inductance is formed ("mutual inductance"). To put it another way, the first inductance and the second inductance are arranged spatially with respect to one another in such a way that these two components are functionally coupled to one another or can interact with one another in a certain way. By way of example, the two inductances may be provided in different but spatially sufficiently closely adjacent processing planes, so that they mutually influence each other with regard to their functionality. It is also possible, for coupling the inductances, to provide the latter as a coil with a center tap.

Refinements of the circuit array according to one embodiment of the invention, which has an integrated circuit arrangement according to one embodiment of the invention, are described below. Refinements of the circuit array also apply to the integrated circuit arrangement, and vice versa.

A useful circuit (for example, useful circuit 1040 of FIG. 10) is understood to mean, in particular, a circuit which can be coupled to the circuit arrangement (for example, circuit arrangement 1020 of FIG. 10) according to one embodiment of the invention or can be operated jointly with said circuit arrangement 1020. Such a circuit system 1000 then contains the circuit arrangement 1020 according to one embodiment of the invention set up for the ESD protection, and additionally the useful circuit 1040, which fulfils the actual functionality, in particular can process a radiofrequency signal in a predeterminable manner.

The useful circuit 1040 may have a GSM circuit ("global system for mobile communications"). GSM technology denotes a mobile radio standard that is principally used for telephony. GSM thus represents a standardized standard for digital mobile radio.

As an alternative, the useful circuit 1040 may be a UMTS circuit ("universal mobile telecommunications system"). UMTS is a mobile radio standard of a more recent generation and includes enhanced multimedia services, satellites and ground-based transmitting stations. UMTS can be used to realize, by way of example, interhuman communication (audio and video telephony) message services (for example Chats), information distribution (for example World Wide Web browsing), enhanced position applications (personal navigation, driver assistance), business services (mobility in closed spaces), or mass services (for example banking services, e-commerce etc).

The useful circuit may 1040 furthermore be realized as a WLAN circuit ("wireless local area network").

The useful circuit 1040 may furthermore have a DCS circuit ("dynamic channel selection"), a DECT circuit ("digital enhanced cordless telecommunications"), a Bluetooth circuit, a UWB circuit ("ultra wide band"), a PCS circuit and/or a RADAR circuit.

For all these useful circuit 1040 applications, the solution according to one embodiment of the invention affords reliable protection against ESD and can thus contribute to improving the functionality of these useful circuits.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 11 illustrates an ESD protection circuit arrangement in accordance with a first exemplary embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A description is given below, referring to FIG. 6, of an ESD protection circuit arrangement 600 in accordance with a first exemplary embodiment of the invention.

Figure 1:
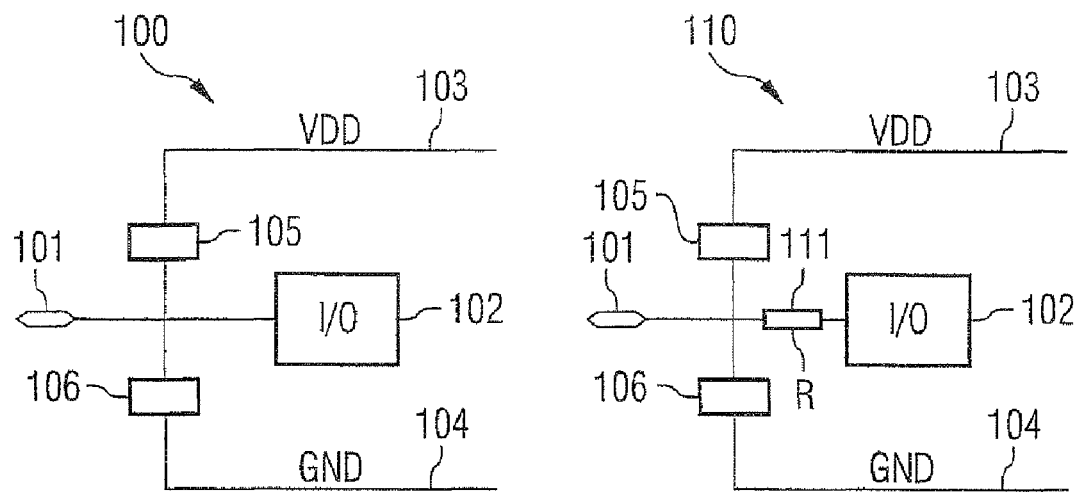
FIG. 1 illustrates a first ESD protection circuit arrangement in accordance with the prior art.
Figure 2:
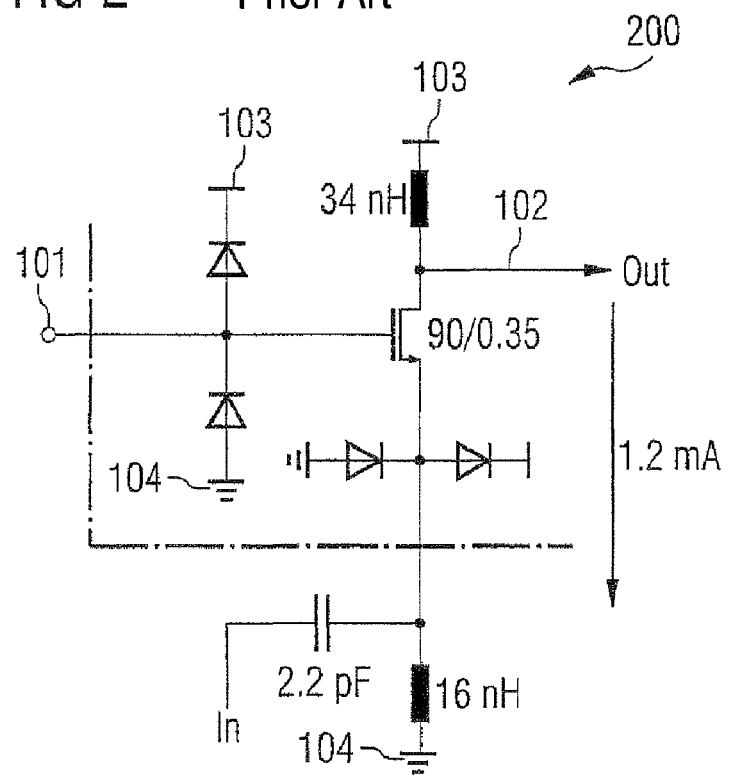
FIG. 2 illustrates a second ESD protection circuit arrangement in accordance with the prior art.
Figure 3:
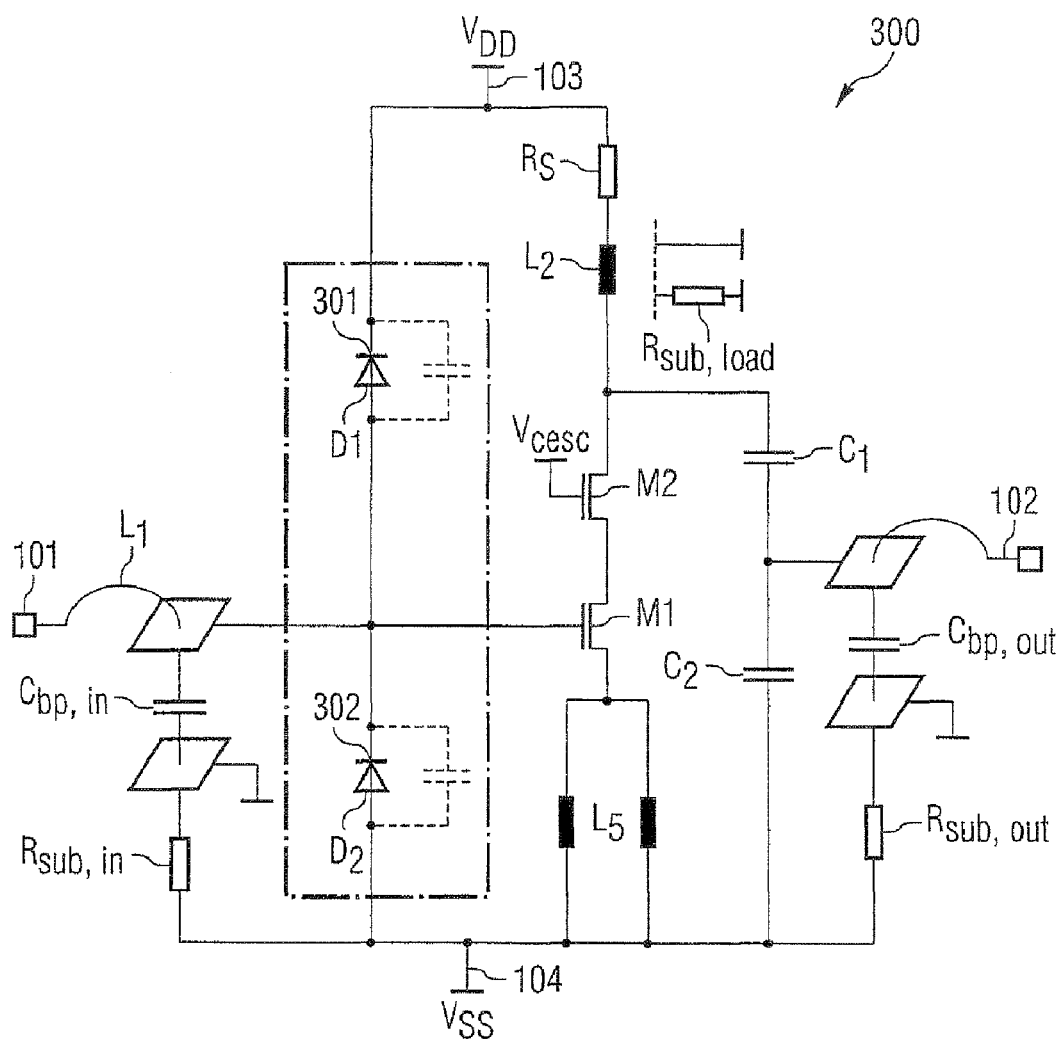
FIG. 3 illustrates a third ESD protection circuit arrangement in accordance with the prior art.
Figure 4:
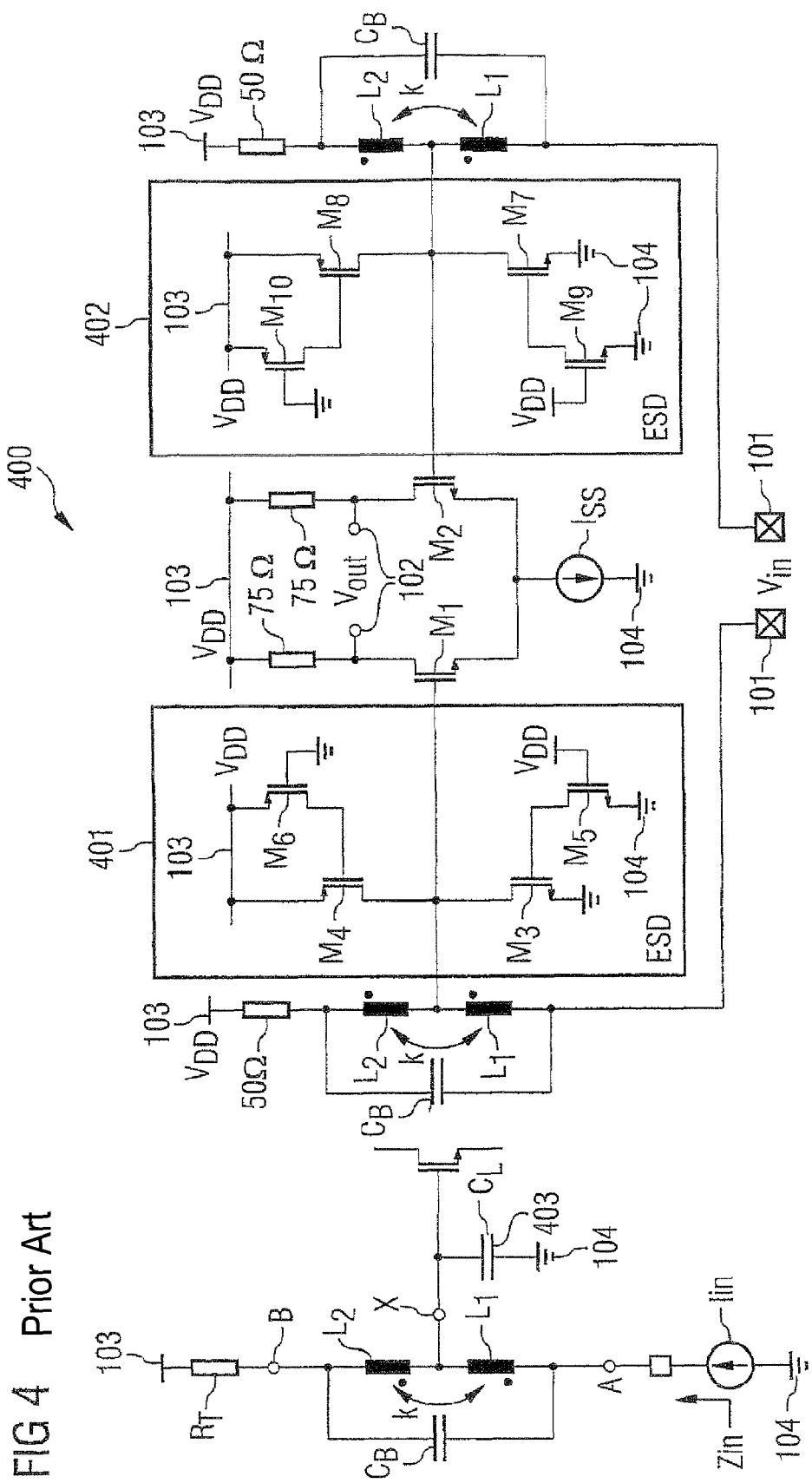
FIG. 4 illustrates a fourth ESD protection circuit arrangement in accordance with the prior art.
Figure 5:
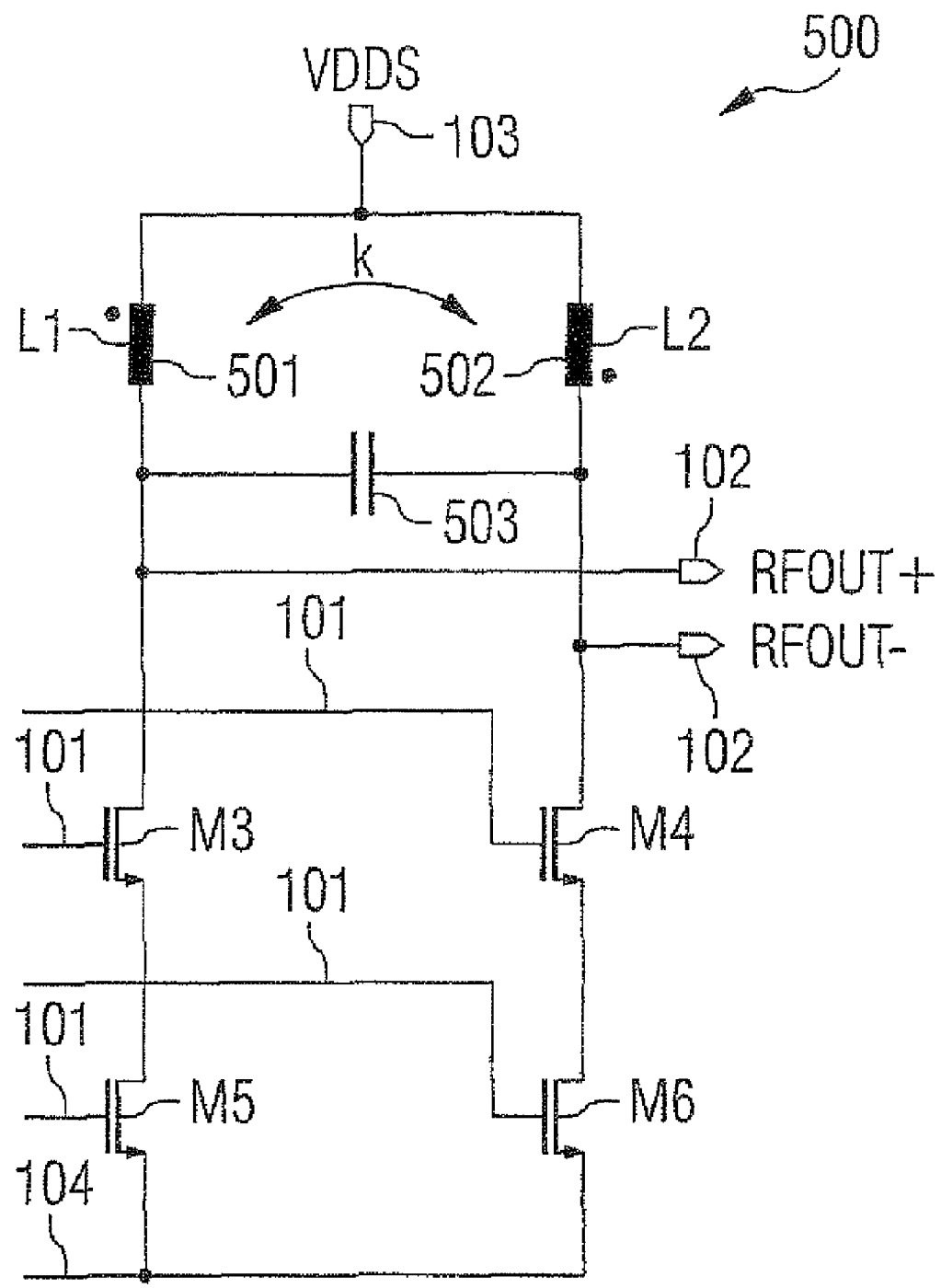
FIG. 5 illustrates a fifth ESD protection circuit arrangement in accordance with the prior art.
Figure 6:
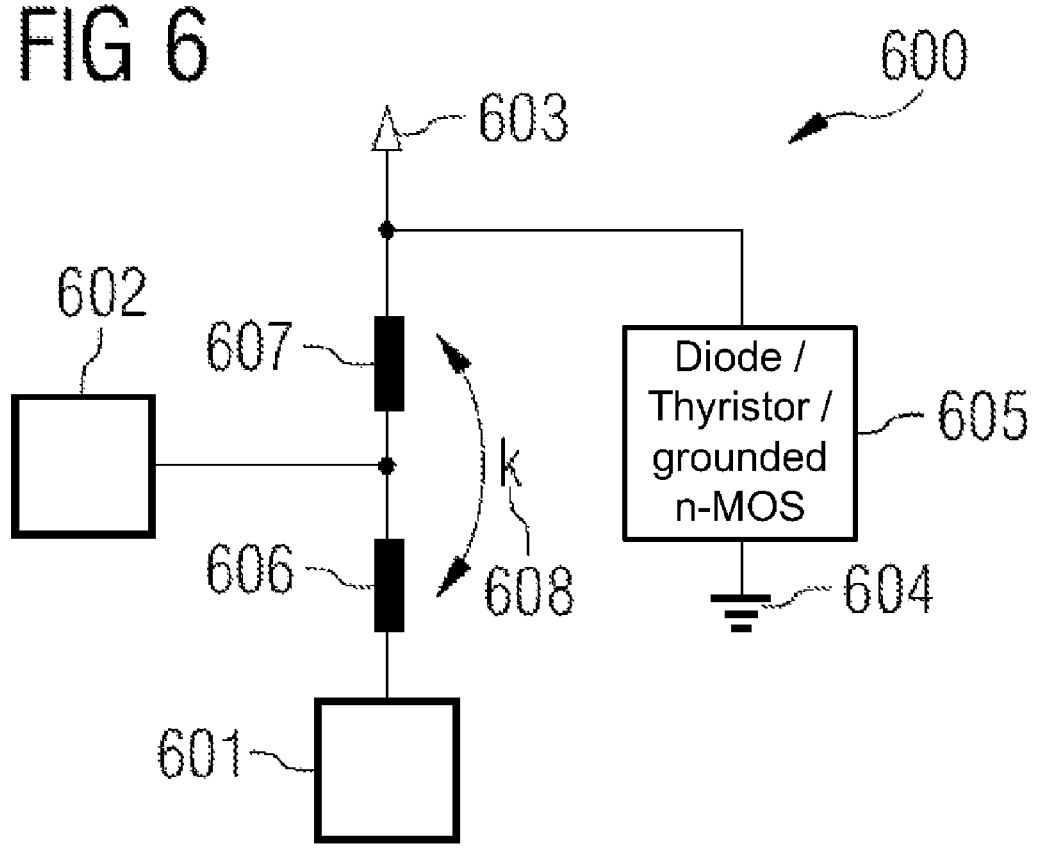
FIG. 6 illustrates an ESD protection circuit arrangement in accordance with a first exemplary embodiment of the invention.

The ESD protection circuit arrangements 600 monolithically integrated in a silicon chip from FIG. 6 contains a first terminal, which is brought to an upper supply potential $V_{DD}$ 603, and a second terminal, which is brought to a lower supply potential $V_{SS}$ (the ground potential 604). A supply potential path is formed between the first terminal and the second terminal. Moreover, an ESD protection element 605 (for example a diode, a thyristor or a grounded n-MOS, as shown in FIG. 6) is connected up in the supply potential path, that is to say between the supply potential 603 and the ground potential 604. Moreover, a signal input 601 is provided, to which an input signal (to be processed) can be applied. A (processed) output signal is provided at a signal output 602. Moreover the ESD protection circuit arrangement 600 contains a first inductance 606, which is arranged between the signal input 601 and the signal output 602. A second inductance 607 is arranged between the signal output 602 and the first terminal, at which the supply potential 603 is provided. The first inductance 606 and the second inductance 607 are in each case provided as components which are monolithically integrated in the silicon chip. The first inductance 606 is coupled to the second inductance 607 in such a way that a coupling inductance 608 is thereby formed, which is also identified by the letter "k" in the drawing.

Figure 7:
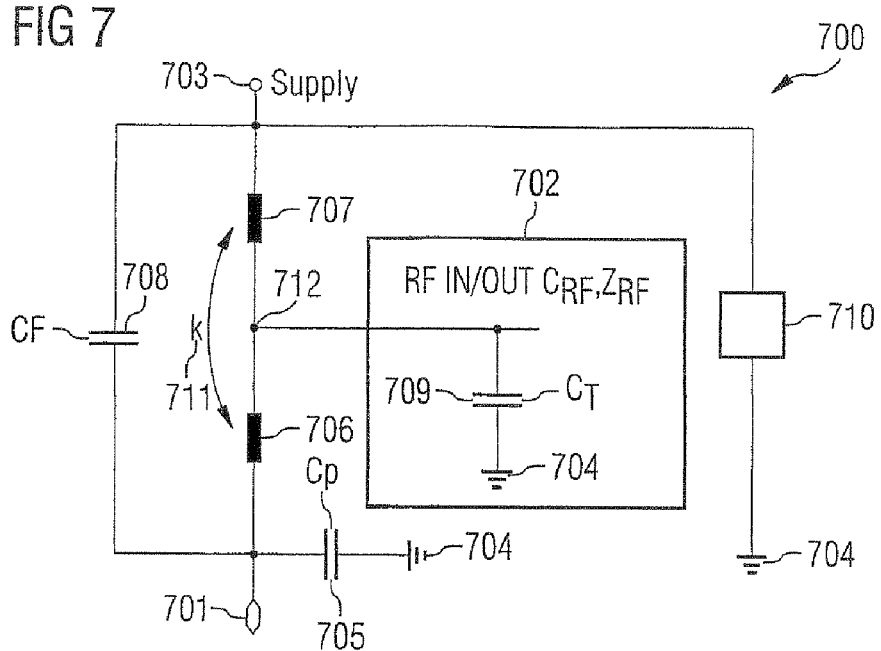
FIG. 7 illustrates an ESD protection circuit arrangement in accordance with a second exemplary embodiment of the invention.

A description is given below, referring to FIG. 7 of an ESD protection circuit arrangement 700 monolithically integrated in a silicon chip in accordance with a second exemplary embodiment of the invention.

In the case of the ESD protection circuit arrangement 700, a first terminal is provided, which is brought to the supply potential 703. Furthermore, a second terminal is provided, which is brought to the ground potential 704. A supply potential path is formed between the supply potential 703 and the ground potential 704. Moreover, a signal input pad 701 (signal input) is provided, to which an input signal to be processed can be applied. An output signal is provided at a signal output, which output signal is fed to the input/output circuit 702. The input/output circuit 702 is characterized by a capacitance $C_{RF}$ and by an impedance $Z_{RF}$.

Moreover, a monolithically integrated first inductance 706 is provided, which is provided between the signal input pad 701 and the input/output circuit 702. A monolithically integrated second inductance 707 is arranged between the supply potential 703 and the input/output circuit 702. The first inductance 706 is coupled to the second inductance 707 in such a way that a coupling inductance 711 is thereby formed, which is also identified by the letter "k" in the drawing. A first capacitor 705 (which is intended to represent a pad capacitance) is brought to the electrical ground potential 704 by one terminal and is coupled, by the other terminal, to the signal input pad 701 and also to a first terminal of a second capacitor 708, the second terminal of which is brought to the supply potential 703. A third capacitor 709 is formed as part of the input/output circuit 702. An ESD protection element 710 is provided in a path between the supply voltage 703 and the ground potential 704.

By the inductances 706, 707 and by the first capacitor 705 as ESD protection element, a reliable ESD protection is realized with the ESD protection circuit arrangement 700.

The value of the capacitance CF, the value L of the coil inductance, and also the values of the capacitance $C_{RF}$ and of the impedance $Z_{RF}$ are design variables by which the input structure can be tuned such that an RF bandpass passband can be ensured.

A node 712 is localized between the two integrated inductances 706, 707.

Figure 8:
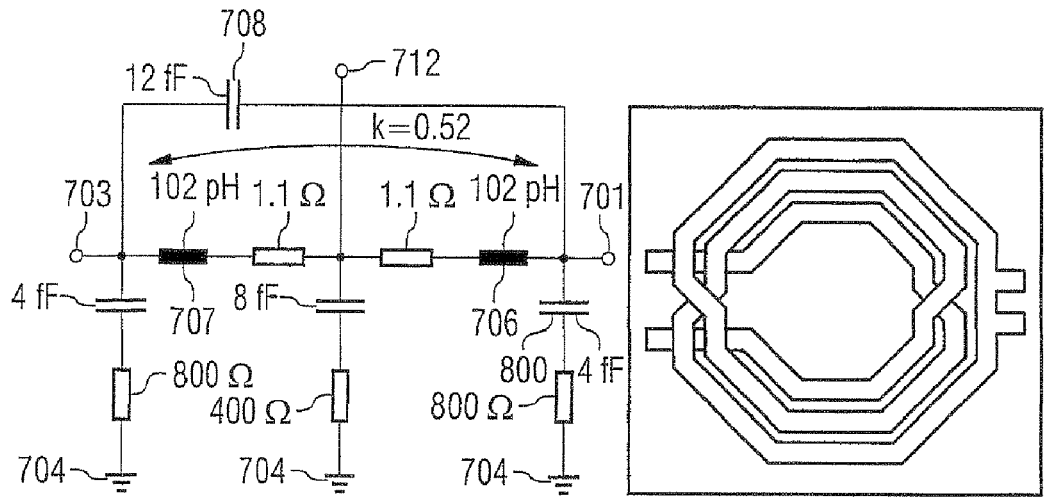
FIG. 8 illustrates another illustration of a part of the ESD protection circuit arrangement in accordance with the second exemplary embodiment of the invention.
Figure 9:
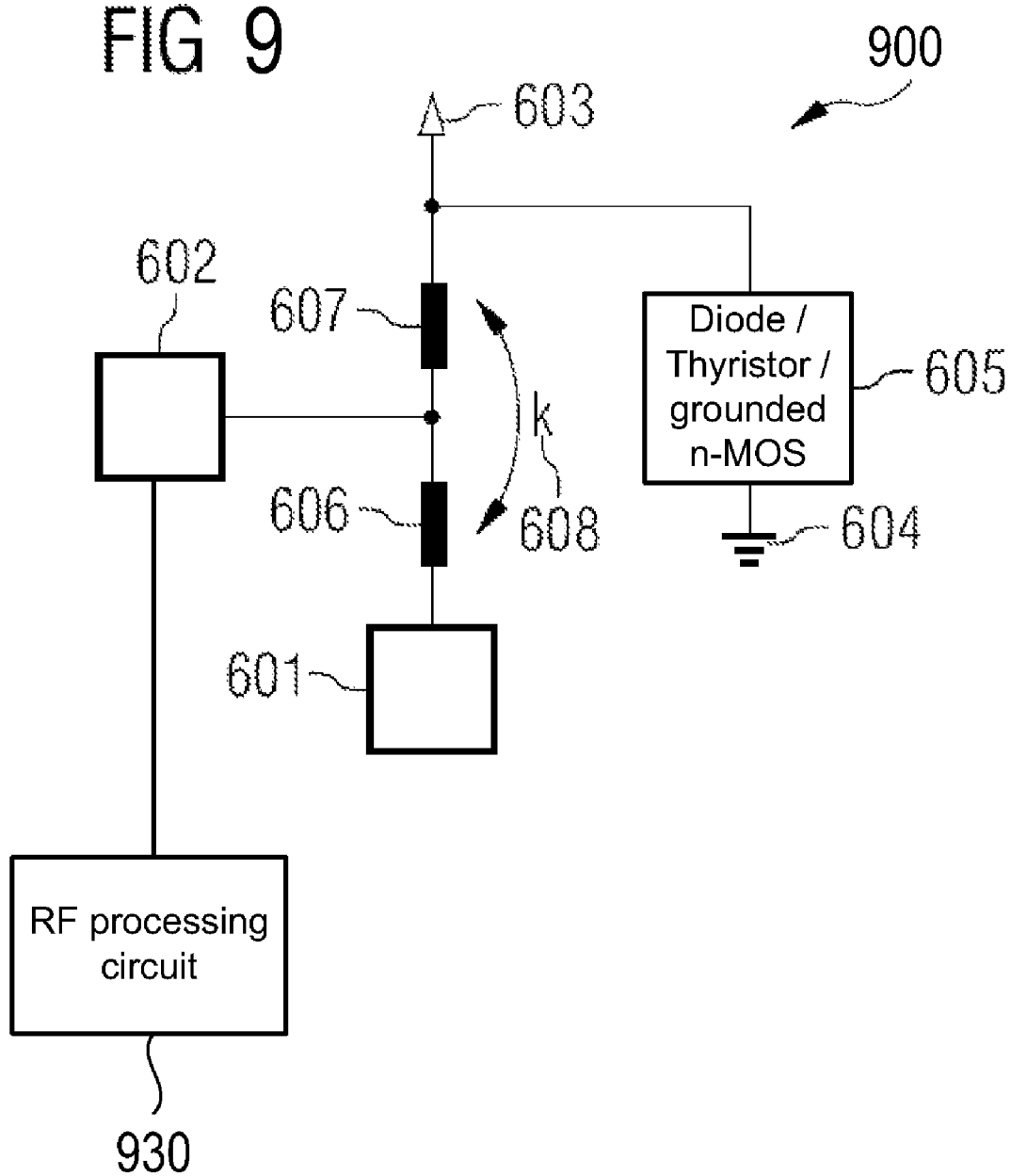
FIG. 9 illustrates an ESD protection circuit arrangement in accordance with an exemplary embodiment of the invention.
Figure 10:
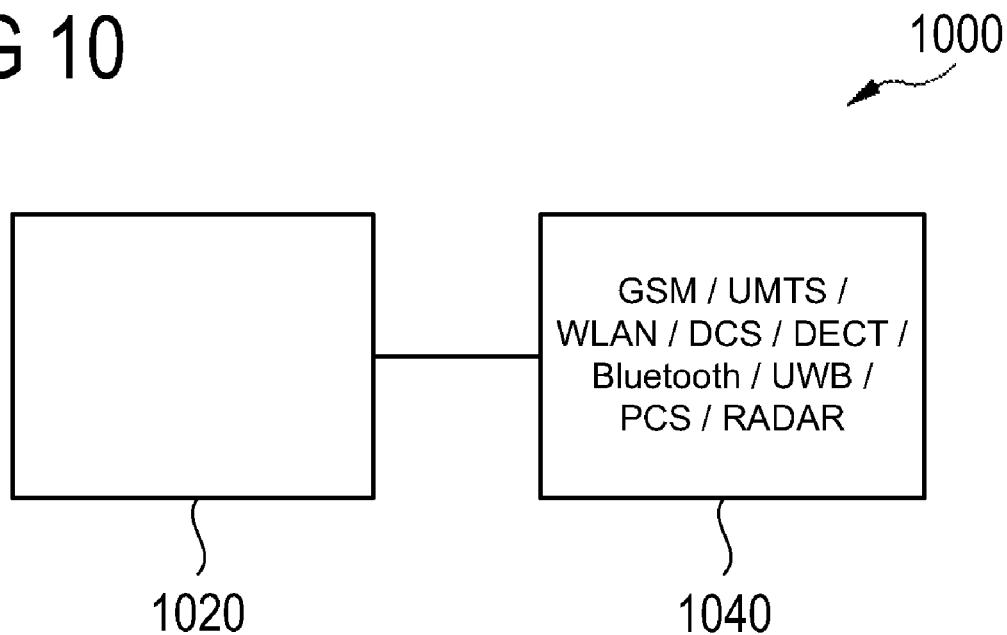
FIG. 10 illustrates an integrated circuit arrangement in accordance with an exemplary embodiment of the invention.

A description is given below, referring to FIG. 8, of an equivalent circuit of a part of the configuration illustrated in FIG. 7, that is to say an exemplary design of some of the components of the ESD protection circuit arrangement 700.

A parasitic coil capacitance 800 of the inductances 706, 707 is formed to the value of 4 fF; an associated nonreactive resistance of 800Ω is furthermore depicted. The first inductance 706 is realized by a coil having an inductance of 102 pH; moreover, a nonreactive resistance of 1.1Ω is provided. The second inductance 707 is formed with a value of 102 pH; moreover, a nonreactive resistance of 1.1Ω is illustrated. The second capacitor 708 is realized with a capacitance of 12 fF. Moreover, additional resistances of 800Ω and 400Ω and additional capacitances of 4 fF and 8 fF are respectively illustrated between the ground potential 704 and the two coil terminals of the second inductance 707.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An integrated circuit arrangement, comprising:
   a first terminal, which can be brought to a first supply potential, a second terminal, which can be brought to a second supply potential, a supply potential path being formed between the first terminal and the second terminal;
   an electrostatic discharge element in the supply potential path;
   a signal input pad, to which an input signal can be applied;
   a signal output, at which an output signal can be provided;
   a first inductance between the signal input pad and the signal output;
   a second inductance between the signal output and the first terminal; and
   a radiofrequency processing circuit connected to the signal output;
   wherein the first inductance and the second inductance are coupled between the signal input pad and the first terminal such that they form a direct current short circuit;
   wherein the electrostatic discharge element is coupled to a node between the first terminal and the second inductance,
   wherein a radiofrequency signal path leads from the signal input pad to the radiofrequency processing circuit via the first inductance, a common node between the first inductance and the second inductance, and the signal output; and
   wherein, between the common node and the radiofrequency processing circuit, the radiofrequency signal path is free from electrostatic discharge elements.

2. The integrated circuit arrangement of claim 1, wherein the first supply potential is an upper operating potential, and the second supply potential is a lower operating potential.

3. The integrated circuit arrangement of claim 1, wherein the first supply potential is a lower operating potential, and the second supply potential is an upper operating potential.

4. The integrated circuit arrangement of claim 1, wherein the electrostatic discharge element comprises a diode.

5. The integrated circuit arrangement of claim 1, wherein the electrostatic discharge element comprises a thyristor.

6. The integrated circuit arrangement of claim 1, wherein the electrostatic discharge element comprises a field-effect transistor.

7. The integrated circuit arrangement of claim 6, wherein the field-effect transistor is a grounded n-MOS field-effect transistor.

8. The integrated circuit arrangement of claim 1, wherein the input signal that can be applied to the signal input pad is a radiofrequency signal.

9. The integrated circuit arrangement of claim 1, wherein the first inductance and the second inductance are provided as common inductance.

10. The integrated circuit arrangement of claim 9, wherein the common inductance is a coil with a center tap, the center tap being coupled to the signal output, a first coil end section being coupled to the signal input pad, and a second coil end section being coupled to the electrostatic discharge element.

11. The integrated circuit arrangement of claim 1 further comprising a first capacitor arranged between the first terminal and the signal input pad.

12. The integrated circuit arrangement of claim 11, further comprising a second capacitor arranged between the second terminal and the signal input pad.

13. The integrated circuit arrangement of claim 1, configured as a bandpass filter for a radiofrequency signal provided at the signal input pad.

14. The integrated circuit arrangement of claim 1, wherein the first inductance and the second inductance are in each case set up as integrated inductance.

15. The integrated circuit arrangement of claim 1, wherein a signal output pad is provided at the signal output.

16. The integrated circuit arrangement of claim 1, wherein the first inductance and the second inductance are coupled in such a way that a coupling inductance is formed.

17. A circuit array, comprising:
   a first terminal at a first supply potential;
   a second terminal at a second supply potential;
   electrostatic discharge means between the first and second terminals for providing a supply potential path;
   a signal input pad coupled to an input signal;
   a signal output providing an output signal;
   a first inductance between the signal input and output pads;
   a second inductance between the signal output and the first terminal; and
   a useful circuit connected to the signal output;
   wherein the first inductance and the second inductance are coupled between the signal input pad and the first terminal such that they form a direct current short circuit;
   wherein the electrostatic discharge means are coupled to a node between the first terminal and the second inductance;
   wherein a radiofrequency signal path leads from the signal input pad to the useful circuit via the first inductance, a common node between the first inductance and the second inductance, and the signal output; and
   wherein, between the common node and the useful circuit, the radiofrequency signal path is free from electrostatic discharge means.

18. The circuit array of claim 17, wherein the useful circuit comprises one of a group comprising:
   a GSM (global system for mobile communications) circuit;
   a UMTS (universal mobile telecommunication system) circuit;

a WLAN (wireless local area network) circuit;
a DCS (dynamic channel selection) circuit;
a DECT (digital enhanced cordless telecommunications) circuit;
a Bluetooth circuit;
a UWB (ultra wide band) circuit;
a PCS (Personal Communications System) circuit; and
a RADAR circuit.

19. A method for protecting a circuit from electrostatic discharge, comprising:
coupling a first terminal with a first supply potential;
coupling a second terminal with a second supply potential;
forming a supply potential path between the first and second terminals;
providing an electrostatic discharge element in the supply potential path;
applying an input signal to a signal input pad;
providing an output signal at a signal output;
providing a first inductance between the signal input pad and the signal output;
providing a second inductance between the signal output and the first terminal; and
connecting a radiofrequency processing circuit to the signal output;
wherein the first inductance and the second inductance are coupled between the signal input pad and the first terminal such that they form a direct current short circuit;
wherein the electrostatic discharge element is coupled to a node between the first terminal and the second inductance;
wherein a radiofrequency signal path leads from the signal input pad to the radiofrequency processing circuit via the first inductance, a common node between the first inductance and the second inductance, and the signal output; and
wherein, between the common node and the radiofrequency processing circuit, the radiofrequency signal path is free from electrostatic discharge elements.

20. The method of claim 19 wherein the first supply potential is an upper operating potential, and the second supply potential is a lower operating potential.

* * * * *

UNITED STATES PATENT AND TRADEMARK OFFICE
CERTIFICATE OF CORRECTION

PATENT NO. : 8,098,471 B2
APPLICATION NO. : 11/574066
DATED : January 17, 2012
INVENTOR(S) : Christoph Kienmayer et al.

It is certified that error appears in the above-identified patent and that said Letters Patent is hereby corrected as shown below:

Column 9, lines 33-35, delete "a first terminal, which can be brought to a first supply potential, a second terminal, which can be brought to a second supply potential" and insert in place thereof --a first terminal supplied with a first potential, a second terminal supplied with a second potential--.

Column 9, line 38, insert --arranged-- after the term "element".

Column 9, line 40, delete "can be" and insert in place thereof --is--.

Column 9, line 41, delete "can be" and insert in place thereof --is--.

Column 9, line 63, delete "supply".

Column 9, line 64, delete "supply".

Column 9, line 66, delete "supply".

Column 9, line 67, delete "supply".

Column 10, line 12, delete "can be" and insert in place thereof --is--.

Column 10, line 41, delete "a first terminal at a first supply potential" and insert in place thereof --a first terminal supplied with a first potential--.

Signed and Sealed this
Nineteenth Day of June, 2012

David J. Kappos
*Director of the United States Patent and Trademark Office*

Column 10, line 42, delete "a second terminal at a second supply potential" and insert in place thereof --a second terminal supplied with a second potential--.